United States Patent
Okubo et al.

(10) Patent No.: US 8,100,589 B2
(45) Date of Patent: Jan. 24, 2012

(54) OPTICAL MODULE AND OPTICAL WAVEGUIDE

(75) Inventors: Miwa Okubo, Kanagawa (JP); Takahiro Arakida, Kanagawa (JP); Hidehiko Nakata, Kanagawa (JP); Terukazu Naruse, Kanagawa (JP)

(73) Assignee: Sony Corporation, Tokyo (JP)

( * ) Notice: Subject to any disclaimer, the term of this patent is extended or adjusted under 35 U.S.C. 154(b) by 469 days.

(21) Appl. No.: 12/320,551

(22) Filed: Jan. 29, 2009

(65) Prior Publication Data

US 2009/0214156 A1 Aug. 27, 2009

(30) Foreign Application Priority Data

Feb. 21, 2008 (JP) ................................. 2008-040200

(51) Int. Cl.
*G02B 6/36* (2006.01)
(52) U.S. Cl. ................. 385/89; 385/88; 385/92
(58) Field of Classification Search ............... 385/88–94
See application file for complete search history.

(56) References Cited

U.S. PATENT DOCUMENTS

| | | | | |
|---|---|---|---|---|
| 5,163,113 | A * | 11/1992 | Melman | 385/31 |
| 6,048,107 | A * | 4/2000 | Pubanz | 385/92 |
| 6,081,638 | A * | 6/2000 | Zhou | 385/31 |
| 6,711,186 | B2 * | 3/2004 | Komeda | 372/29.02 |
| 6,848,839 | B2 * | 2/2005 | Steinberg | 385/88 |
| 7,057,158 | B2 * | 6/2006 | Luo | 250/227.24 |
| 2007/0248301 | A1 * | 10/2007 | Terashima et al. | 385/35 |

FOREIGN PATENT DOCUMENTS

| | | |
|---|---|---|
| JP | 09-015440 | 1/1997 |
| JP | 3204439 | 6/2001 |
| JP | 2004-233687 A | 8/2004 |
| JP | 2006-184754 | 7/2006 |
| JP | 2007-025382 A | 2/2007 |
| JP | 2007-072307 A | 3/2007 |
| JP | 2007-178790 A | 7/2007 |

OTHER PUBLICATIONS

Japanese Office Action issued Jan. 27, 2010 for corresponding Japanese Application No. 2008-040200.
Japanese Office Action issued Apr. 7, 2010 for corresponding Japanese Application No. 2008-040200.

* cited by examiner

*Primary Examiner* — Rhonda Peace
(74) *Attorney, Agent, or Firm* — Rader, Fishman & Grauer PLLC

(57) ABSTRACT

An optical module includes an optical waveguide including a waveguide core through which light propagates and a clad configured to trap the light in the waveguide core, and a circuit board on which a surface-type optical element is mounted. The optical waveguide further includes a reflective surface from which an end face of the waveguide core is exposed, the reflective surface being provided on an inclined face at one end face of the optical waveguide core in an extending direction of the waveguide core, and an element mount opening provided in the clad such as to be opposite from the reflective surface, the element mount opening having a size such as to contain the optical element. The optical waveguide is mounted on the circuit board while the optical element is contained in the element mount opening and is aligned with the reflective surface of the optical waveguide.

8 Claims, 10 Drawing Sheets

OPTICAL MODULE AND OPTICAL WAVEGUIDE

CROSS REFERENCES TO RELATED APPLICATIONS

The present invention contains subject matter related to Japanese Patent Application JP 2008-040200 filed in the Japanese Patent Office on Feb. 21, 2008, the entire contents of which are incorporated herein by reference.

BACKGROUND OF THE INVENTION

1. Field of the Invention

The present invention relates to an optical waveguide having a reflective surface that allows perpendicularly incident light to enter and exit from waveguide cores through which the light propagates, and to an optical module including the optical waveguide. More particularly, the present invention relates to formation of a space in which an optical element to be optically coupled to waveguide cores is mounted, by using a clad opposite the reflective surface.

2. Description of the Related Art

Information transmission has hitherto been performed between boards and between chips in electronic apparatuses by means of electric signals. In order to realize information transmission with a larger capacity at a higher speed, optical interconnection techniques have attracted attention. As one optical interconnection technique, an optical module of a waveguide type using a planar optical waveguide has been proposed.

Japanese Patent No. 3204439 proposes an optical module of such a waveguide type. In this optical module, a projection on which an optical element is to be mounted is formed on a silicon substrate by anisotropic etching, an optical waveguide is formed on the silicon substrate, and the optical element is mounted on the projection of the silicon substrate. This allows an end face of a core of the optical waveguide to be opposed and optically coupled to the optical element.

Since a surface-type optical element can be produced by an easier process than that for an edge-type optical element and is suitable for surface mounting, it is more advantageous than the edge-type optical element from the viewpoint of cost reduction. In particular, a surface emitting semiconductor laser (VCSEL) is capable of high-speed direct modulation, and is extremely promising as a device for a low-cost optical module. Thus, there is a demand for low-cost optical modules using surface-type light-emitting or light-receiving elements.

Japanese Unexamined Patent Application Publication No. 2006-184757 proposes an optical module of a waveguide type to which such a surface-type optical element is applied. In this optical module, a reflective surface inclined 45° is provided at an end of an optical waveguide so that an optical element can be placed on a lower side of the optical waveguide opposite the reflective surface.

In this optical module disclosed in the above publication, the optical waveguide and the optical element are mounted on a silicon platform, and the silicon platform has a recess in which the optical element is mounted. With this structure, the optical element is placed on the lower side of the optical waveguide opposite the reflective surface. The silicon platform on which the optical waveguide and the optical element have been mounted is mounted on a circuit board.

SUMMARY OF THE INVENTION

However, in the optical modules of the related art, a substrate on which the optical element is mounted is formed by a member separate from the optical waveguide. As the number of components increases, the number of steps of forming the projection or the recess in the substrate on which the optical element is mounted increases. This makes cost reduction and mass production difficult.

Accordingly, it is desirable to provide an optical waveguide that can change the optical path by a reflective surface and that has a space in which an optical element to be optically coupled to waveguide cores of the optical waveguide is mounted, and to provide an optical module including the optical waveguide.

An optical module according to an embodiment of the present invention includes an optical waveguide including a waveguide core through which light propagates, and a clad configured to trap the light in the waveguide core; and a circuit board on which a surface-type optical element is mounted. The optical waveguide further includes a reflective surface from which an end face of the waveguide core is exposed, the reflective surface being provided on an inclined face at one end face of the optical waveguide in an extending direction of the waveguide core, and an element mount opening provided in the clad such as to be opposite from the reflective surface, the element mount opening having a size such as to contain the optical element. The optical waveguide is mounted on the circuit board while the optical element is contained in the element mount opening and is aligned with the reflective surface of the optical waveguide.

In this optical module, by virtue of the element mount opening provided in the clad such as to be opposite from the reflective surface of the optical waveguide, a space in which the optical element is mounted is ensured by the material that forms the optical waveguide.

Thus, without using any separate member for adjusting the height of the optical waveguide, the optical waveguide is mounted on the circuit board, and the optical element mounted on the circuit board is contained in the element mount opening of the optical waveguide and is optically coupled to the waveguide core of the optical waveguide via the reflective surface.

An optical waveguide according to another embodiment of the present invention includes a waveguide core through which light propagates; a clad configured to trap the light in the waveguide core; a reflective surface from which an end face of the waveguide core is exposed, the reflective surface being provided on an inclined face at one end of the optical waveguide in an extending direction of the waveguide core; and an element mount opening provided in the clad such as to be opposite from the reflective surface, the element mount opening having a size such as to contain an optical element to be optically coupled to the waveguide core via the reflective surface.

In this optical waveguide, by virtue of the element mount opening provided in the clad such as to be opposite from the reflective surface of the optical waveguide, a space in which the optical element to be optically coupled to the waveguide core via the reflective surface is mounted is ensured by the material that forms the optical waveguide.

According to the embodiments of the present invention, since the element mount opening is provided in the clad of the optical waveguide, the optical element can be mounted such as to be opposite from the reflective surface of the optical waveguide without separately preparing any platform for ensuring the height of the optical waveguide in accordance with the optical element.

Therefore, the step of sticking the optical waveguide to the platform for adjusting the height can be omitted. The step of forming the platform can also be omitted. Further, since the height of the optical waveguide in which the element mount opening is formed is ensured by the material that forms the optical waveguide, the material cost can be reduced.

From the above, it is possible to easily mass-produce optical modules and to reduce the cost.

DESCRIPTION OF THE PREFERRED EMBODIMENTS

Figure 1:
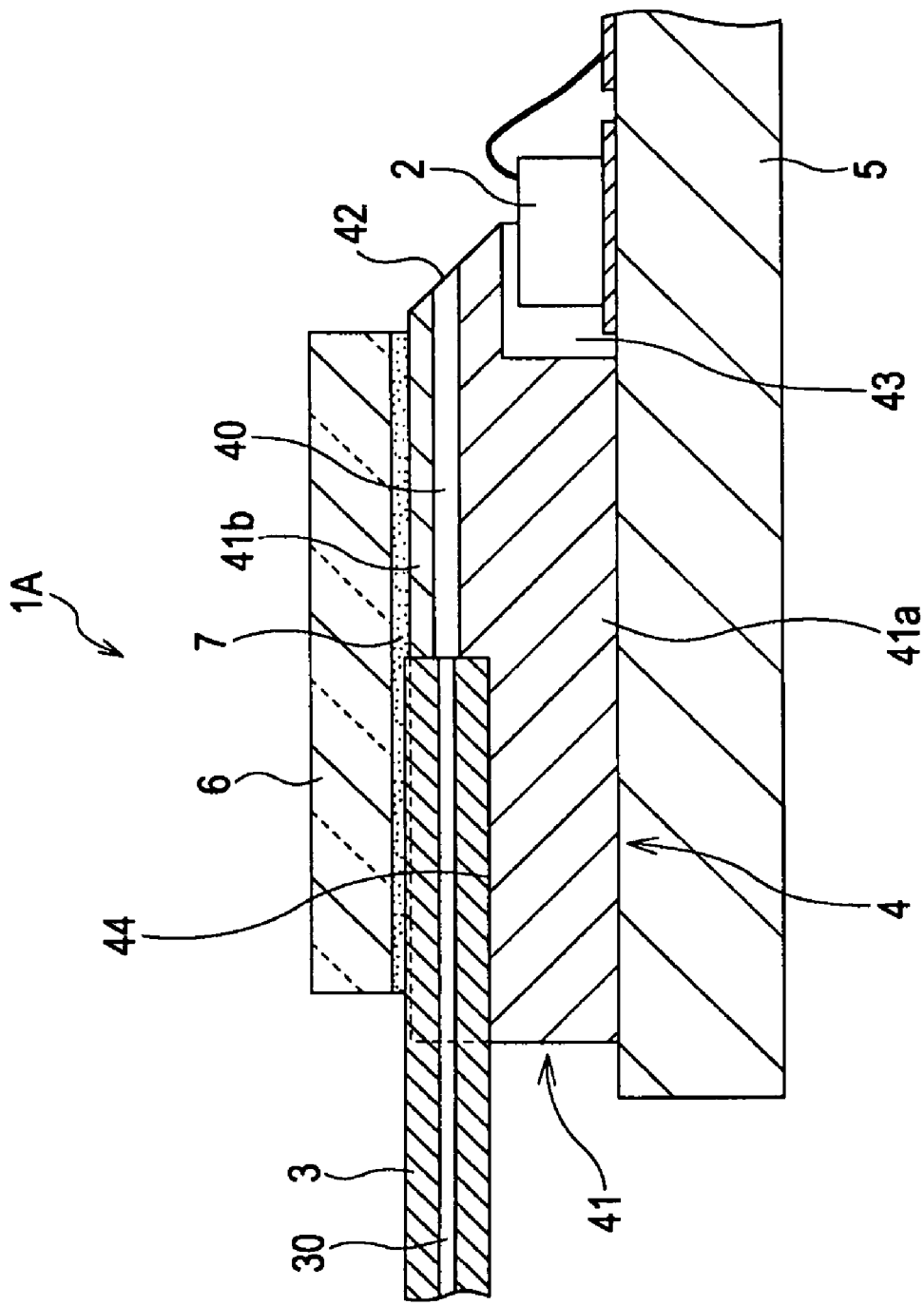
FIG. 1 is a cross-sectional side view of an optical module according to an embodiment.
Figure 2:
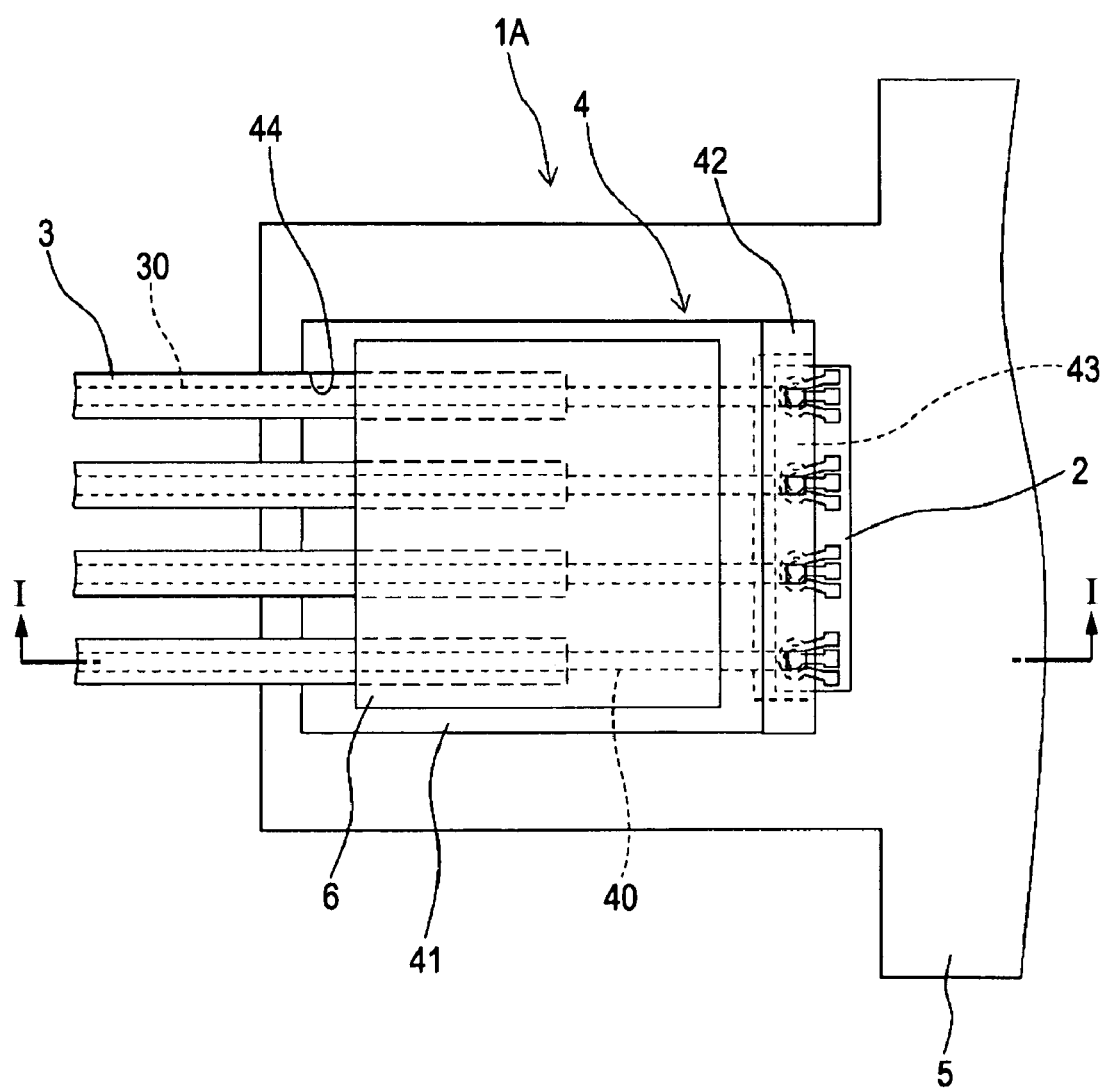
FIG. 2 is a plan view of the optical module.
Figure 3:
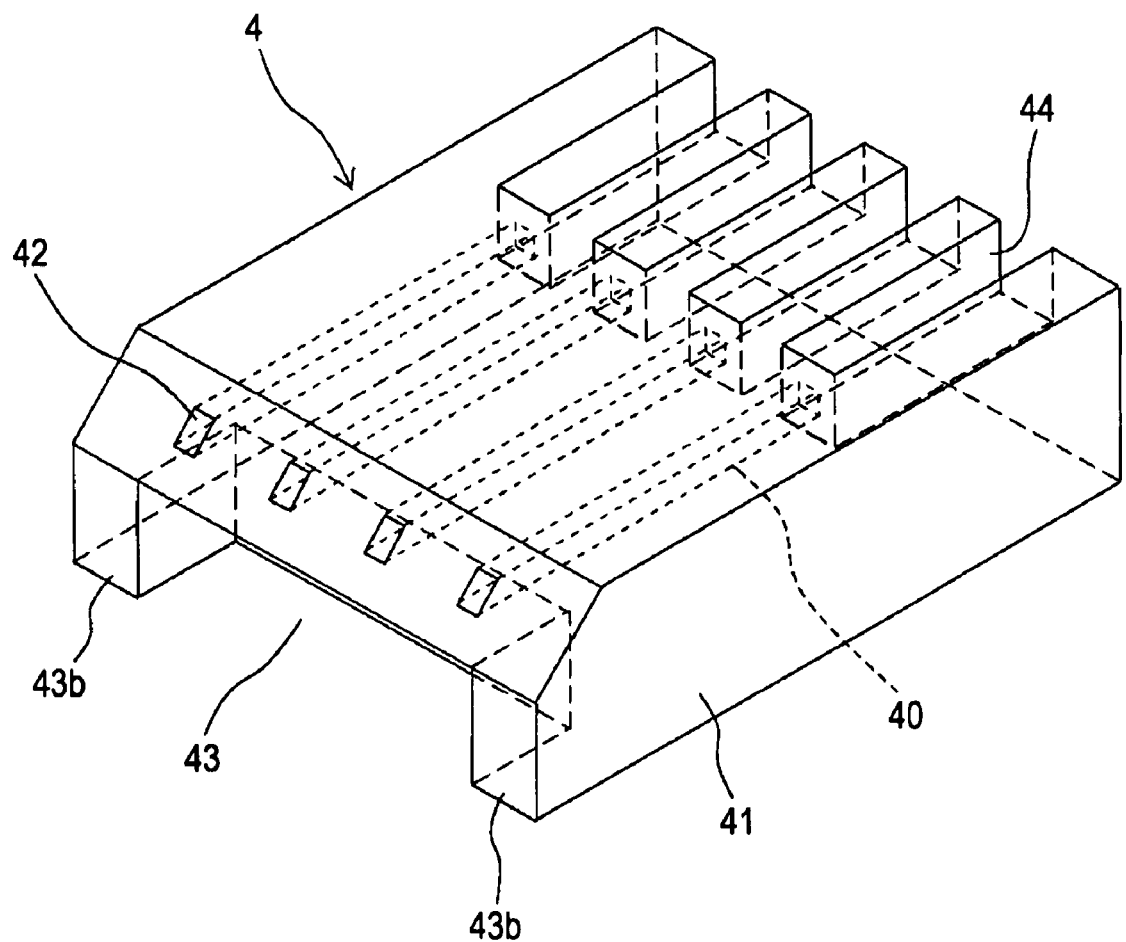
FIG. 3 is a perspective view of an optical waveguide according to the embodiment.
Figure 4:
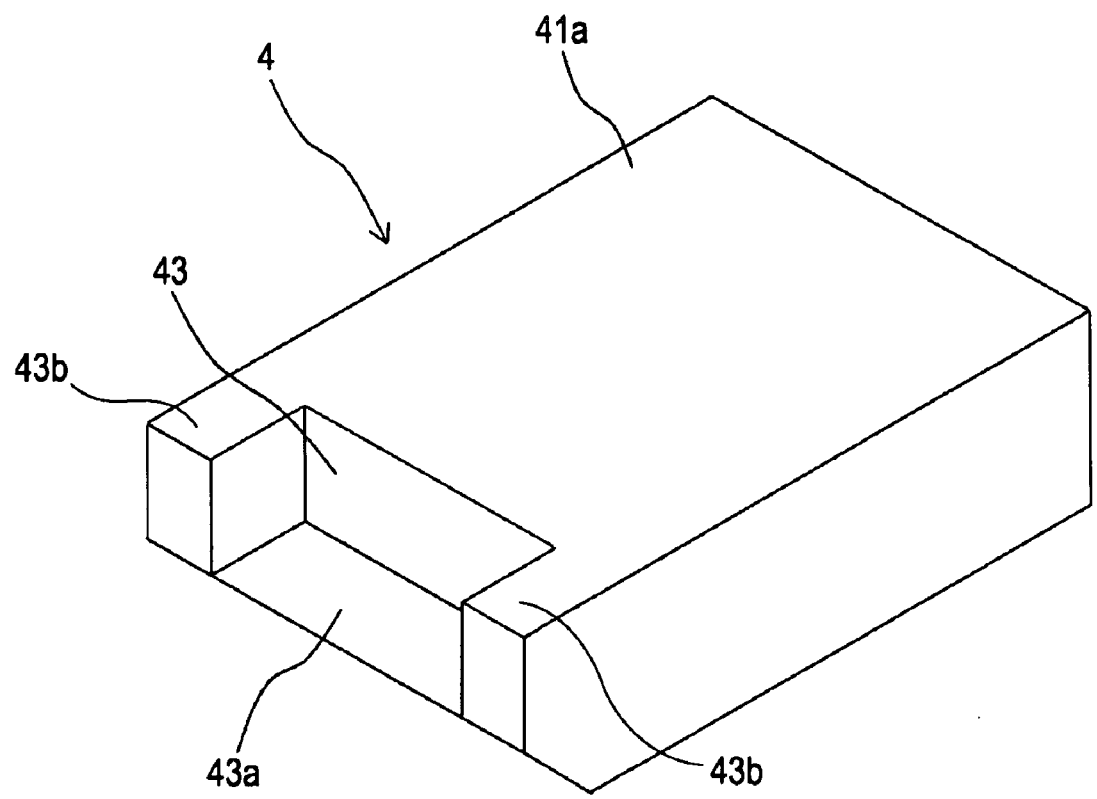
FIG. 4 is a perspective view of the optical waveguide.
Figure 5A:
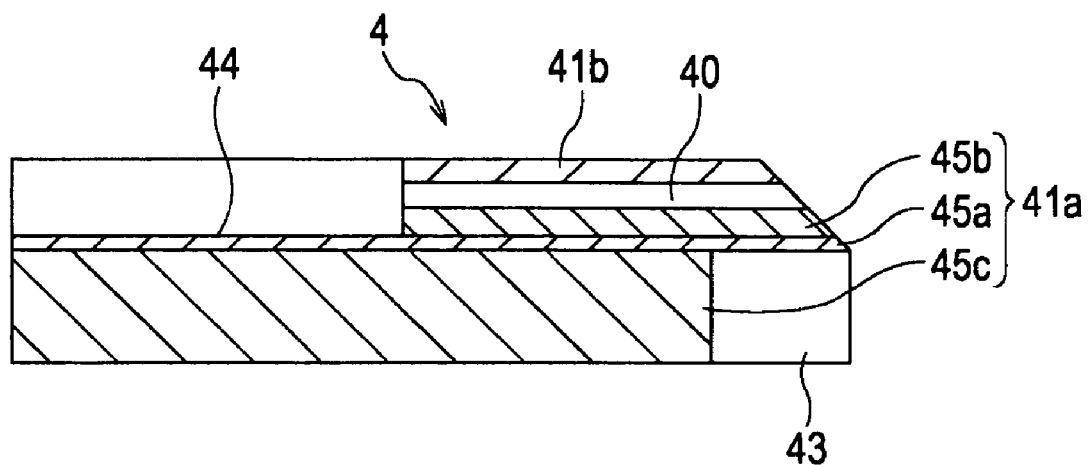
FIGS. 5A and 5B are cross-sectional views of the optical waveguide.
Figure 5B:
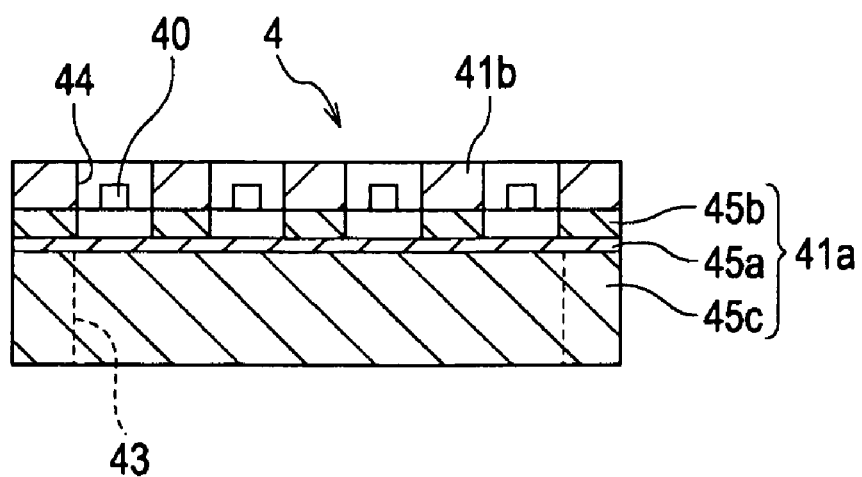

An optical module and an optical waveguide according to an embodiment of the present invention will be described below with reference to the drawings.
Structures Examples of Optical Module and Optical Waveguide According to Embodiment FIG. 1 is a cross-sectional side view of an optical module according to an embodiment, and FIG. 2 is plan view of the optical module. FIG. 1 is a cross-sectional view, taken along line I-I in FIG. 2. FIGS. 3 and 4 are a top perspective view and a bottom perspective view, respectively, of an optical waveguide according to the embodiment. FIG. 5 is a cross-sectional view of the optical waveguide.

An optical module 1A according to this embodiment includes a surface-type optical element 2 and an optical waveguide 4. The optical element 2 includes light emitting elements such as surface emitting semiconductor lasers (VCSEL) or light receiving elements such as photodiodes (PD). The optical waveguide 4 connects the optical element 2 to optical fibers 3. The optical element 2 and the optical waveguide 4 are mounted on a circuit board 5.

For example, the optical element 2 is a laser array in which a plurality of light emitting elements are arranged in parallel at regular intervals or a photodiode array in which a plurality of light receiving elements are arranged in parallel at regular intervals. In the optical element 2, only light emitting elements or only light receiving elements are arranged in parallel, or light emitting elements and light receiving elements may be arranged in parallel in combination.

The optical waveguide 4 is formed of a material that transmits light having a predetermined wavelength. The optical waveguide 4 includes one or a plurality of waveguide cores 40 through which light propagates, and a clad 41 that traps the light in the waveguide cores 40. The waveguide cores 40 and the clad 41 are integrally formed of, for example, a photosensitive acrylic polymeric material in a predetermined shape by a photolithographic process.

In the optical waveguide 4, the waveguide cores 40 are provided on an under clad 41a that constitutes the clad 41. The waveguide cores 40 have a refractive index slightly higher than the refractive index of the clad 41. In this embodiment, four linear waveguide cores 40 are arranged in parallel.

Further, an over clad 41b that constitutes the clad 41 is provided on the under clad 41a on which the waveguide cores 40 are provided. Thus, the optical waveguide 4 has a buried structure. Light incident on the waveguide cores 40 propagates while being trapped therein.

When a side of the optical waveguide 4 where the under clad 41a is provided is defined as a lower side and a side of the optical waveguide 4 where the over clad 41b is provided is defined as an upper side, the under clad 41a has a height such that the optical element 2 can be mounted on the lower side of the optical waveguide 4.

The optical waveguide 4 has a reflective surface 42 at one end face in the extending direction of the waveguide cores 40. The reflective surface 42 is provided on an inclined face with an inclination angle of about 45° at the one end face of the optical waveguide 4 so that core end faces of the waveguide cores 40 are exposed therefrom.

The optical waveguide 4 also includes an element mount opening 43 on the lower side opposite from the reflective surface 42. The element mount opening 43 is provided in the under clad 41a corresponding to the position where the reflective surface 42 is provided, and has a size such as to contain the optical element 2.

A portion of the under clad 41a having a predetermined thickness is provided between the element mount opening 43 and the waveguide cores 40 on the lower side opposite from the reflective surface 42. At the top of the element mount opening 43, a light incident/exit surface 43a is provided.

Thus, light that substantially perpendicularly enters the incident/exit surface 43a toward the reflective surface 42 is totally reflected by the reflective surface 42 serving as an interface with air so that an optical path of the light is turned about 90°, and then enters the waveguide cores 40. On the other hand, light propagating through the waveguide cores 40 toward the reflective surface 42 is totally reflected by the reflective surface 42 so that the optical path of the light is turned about 90°, and exits from the incident/exit surface 43a in a substantially perpendicular direction.

Portions of the under clad 41a on the right and left sides of the element mount opening 43 in the direction in which the waveguide cores 40 are arranged in parallel form waveguide support portions 43b.

The optical waveguide 4 also includes fiber guide grooves 44 at the other end face in the extending direction of the waveguide cores 40. Optical fibers 3 are inserted in the fiber guide grooves 40. The fiber guide grooves 44 are open at the other end face of the optical waveguide 4, are rectangular in cross section, and linearly extend from the waveguide cores 40. Terminal ends of the fiber guide grooves 44 are formed by faces perpendicular to the waveguide cores 40, and end faces of the waveguide cores 40 are exposed from the terminal ends.

The depth of the fiber guide groove 44 is slightly smaller than the diameter of the optical fibers 3, and the width of the fiber guide grooves 44 is substantially equal to the diameter of the optical fibers 3.

Hence, when the optical fibers 3 are inserted in the fiber guide grooves 44 of the optical waveguide 4, little space is formed between the outer peripheral surfaces of the optical fibers 3 and inner wall faces of the fiber guide grooves 44. This restricts the radial movement of the optical fibers 3.

The positions of the fiber guide grooves 44 are set so that the optical axes of the waveguide cores 40 of the optical waveguide 4 are aligned with the optical axes of cores 30 of the optical fibers 30 when the optical fibers 3 are inserted in the fiber guide grooves 44.

Therefore, when the optical fibers 3 are inserted in the fiber guide grooves 44, the center positions of the cores 30 of the optical fibers 3 are adjusted so that the optical axes thereof are aligned with the optical axes of the waveguide cores 40, and the optical fibers 3 and the waveguide cores 40 are thereby coupled optically. Thus, the optical waveguide 4 and the optical fibers 3 can be connected by passive alignment with a mechanical positioning accuracy.

Elements and circuits for driving the optical element 2 are mounted on a circuit board 5, and the optical element 2 mounted on the circuit board 5 is electrically connected to the elements. The optical waveguide 4 is also mounted on the circuit board 5 with an adhesive.

The optical waveguide 4 is mounted at a predetermined position on the circuit board 5 on which the optical element 2 is mounted, in a manner such that the under clad 41a faces down. A lower surface of the under clad 41a is fixed to the circuit board 5 with an adhesive, so that the optical waveguide 4 is supported on the circuit board 5 by the under clad 41a.

When the optical waveguide 4 is placed on the circuit board 5 with the under clad 41a facing down, a space in which the optical element 2 is mounted is defined by the element mount opening 43 below the reflective surface 42.

Thus, the optical element 2 is mounted below the reflective surface 42 of the optical waveguide 4 without providing a separate member for adjusting the height on the lower side of the optical waveguide 4.

When the optical element 2 is a light emitting element, the reflective surface 42 is aligned with a light emitting section of the optical element 2 (not shown). When the optical element 2 is a light receiving element, the reflective surface 42 is aligned with a light receiving section of the optical element 2 (not shown). In this state, the waveguide cores 40 in the optical waveguide 4 are optically coupled to the optical element 2 by the reflective surface 42.

In a step of mounting the optical waveguide 4 on the circuit board 5 with an adhesive, a thermosetting adhesive is not used, but, for example, an ultraviolet curable adhesive is used in order to prevent the optical waveguide 4 from being heated. Since the optical waveguide 4 transmits ultraviolet rays, when ultraviolet rays are applied after the optical waveguide 4 is placed on the circuit board 5 on which the optical element 2 has been mounted and is aligned with the optical element 2, the adhesive between the optical waveguide 4 and the circuit board 5 can be cured, so that the optical waveguide 4 can be fixed to the circuit board 5.

While a portion of the optical waveguide 4 on the lower side of the reflective surface 42 is separate from the circuit board 5 in a state in which the optical waveguide 4 is mounted on the circuit board 5, the right and left sides of the optical waveguide 4 in the direction in which the waveguide cores 40 are arranged in parallel are supported on the circuit board 5 by the waveguide support portions 43b. This minimizes deformation of the end where the reflective surface 42 is provided.

In the step of mounting the optical waveguide 4 on the circuit board 5, the optical waveguide 4 and the optical element 2 can be aligned by passive alignment utilizing image recognition with reference to markers (not shown) provided on the upper surface of the optical element 2 so as to indicate the reference position.

The optical waveguide 4 mounted on the circuit board 5 and the optical fibers 3 inserted in the fiber guide grooves 44 of the optical waveguide 4 are fixed and covered together with a fixing cover 6.

For example, the fixing cover 6 is formed of a transparent inorganic material such as glass. In this embodiment, the fixing cover 6 is rectangularly shaped in accordance with the outer shape of the optical waveguide 4.

The fixing cover 6 has a size such as to collectively cover the optical fibers 3 inserted in the fiber guide grooves 44, coupling portions between the optical fibers 3 and the waveguide cores 40 where the leading ends of the optical fibers 3 are in contact with the fiber guide grooves 44 reach, and the adjacency of the end of the reflective surface 42 where the optical element 2 and the optical waveguide 4 are coupled.

The fixing cover 6 and the optical fibers 3 are fixed to the optical waveguide 4 with an adhesive 7. The adhesive 7 is poured between the entire lower surface of the fixing cover 6 and an upper surface of the over clad 41b of the optical waveguide 4A and around the optical fibers 3 inserted in the fiber guide grooves 44.

The adhesive 7 is also poured between the leading ends of the optical fibers 3 inserted in the fiber guide grooves 44 and the terminal ends of the fiber guide grooves 44 from which the end faces of the waveguide cores 40 are exposed.

For this reason, the adhesive 7 has a refractive index close to the refractive index of the cores 30 of the optical fiber 3 and the waveguide cores 40 of the optical waveguide 4.

When the optical fibers 3 are inserted in the fiber guide grooves 44, the end faces of the cores 30 of the optical fibers 3 face the end faces of the waveguide cores 40. Since the adhesive 7 having a refractive index close to the refractive index of the cores 30 and the waveguide cores 40 is provided therebetween, coupling loss is minimized at the coupling portions between the optical fibers 3 and the optical waveguide 4.

In a step of mounting the fixing cover 6 on the optical waveguide 4 with the adhesive 7, a thermosetting adhesive is not used, but, for example, an ultraviolet curable adhesive is used in order to prevent the optical waveguide 4 from being heated. Since the fixing cover 6 transmits ultraviolet rays, when ultraviolet rays are applied after the optical fibers 3 are inserted in the fiber guide grooves 44 of the optical waveguide 4 mounted on the circuit board 5, the adhesive 7 between the fixing cover 6 and the optical waveguide 4 can be cured, so that the fixing cover 6 and the optical fibers 3 can be fixed to the optical waveguide 4.

Example of Production Procedure for Optical Waveguide in the Embodiment

In the optical waveguide 4 according to this embodiment, the fiber guide grooves 44 and the element mount opening 43 are formed by, for example, a photolithographic process.

FIGS. 6 to 10 are explanatory views illustrating an example of a production procedure for the optical waveguide of the embodiment. A production procedure for the optical waveguide 4 having the fiber guide groove 44 and the element mount opening 43 will be described below.

Figure 6A:
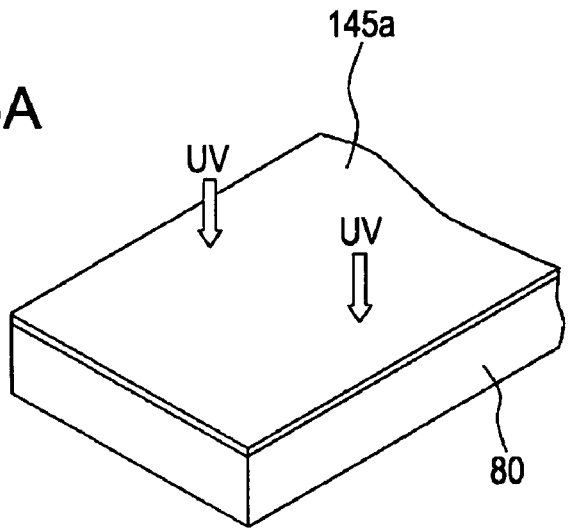
FIGS. 6A to 6C are explanatory views illustrating a production procedure for the optical waveguide.

First, as shown in FIG. 6A, a buffer-clad-layer forming film 145a having a predetermined thickness is applied on a wafer substrate 80 by using, for example, an ultraviolet curable acrylic polymeric material. In this embodiment, the buffer-clad-layer forming film 145a is formed of a material that forms the clad 41 shown in FIG. 1.

Next, the buffer-clad-layer forming film 145a is cured by the irradiation of ultraviolet rays UV and is subjected to heat treatment, so that a buffer clad layer 45a that forms the under clad 41a shown in FIG. 1 is formed.

Figure 6B:
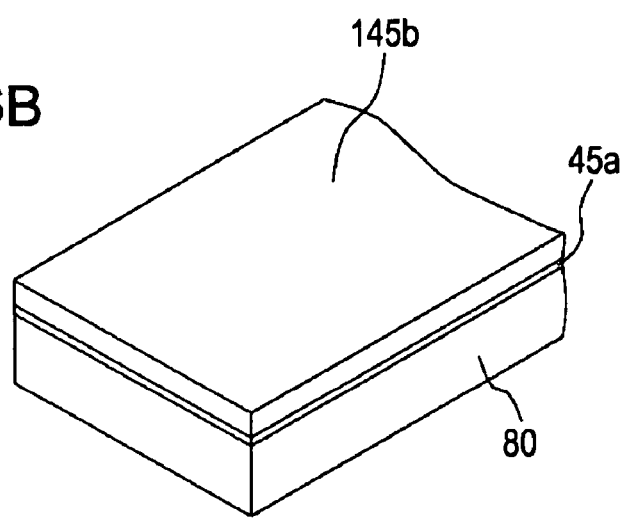

Then, as shown in FIG. 6B, an under-clad-layer forming film 145b having a predetermined thickness is applied on the buffer clad layer 45a formed on the wafer substrate 80. The under-clad-layer forming film 145b is formed of the ultraviolet curable acrylic polymeric material that forms the clad 41.

Figure 6C:
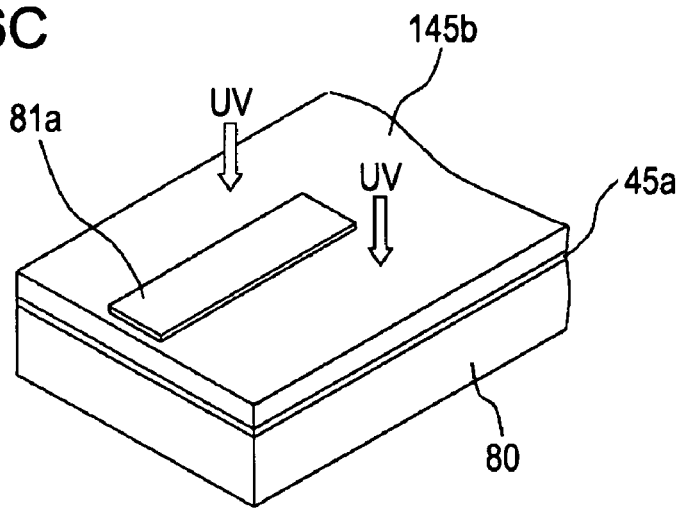

Subsequently, as shown in FIG. 6C, the under-clad-layer forming film 145b is irradiated with ultraviolet rays UV via a photomask 81a having a pattern of the fiber guide groove 44 shown in FIG. 2, and a portion of the under-clad-layer forming film 145b other than a portion corresponding to the fiber guide grooves 44 is cured.

Figure 7D:
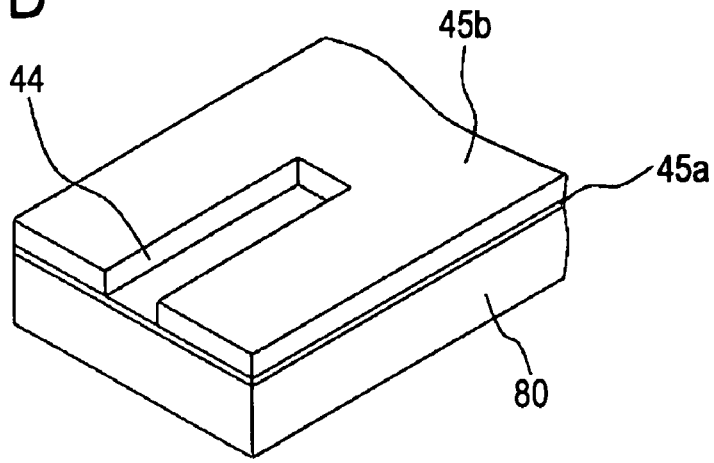
FIGS. 7D to 7F are explanatory views illustrating the production procedure for the optical waveguide.

Then, as shown in FIG. 7D, the portion corresponding to the fiber guide groove 44 is removed, for example, by solution development, and heat treatment is performed so as to form an under clad layer 45b that forms the under clad 41a. In solution development, for example, TMAH (tetramethyl ammonium hydroxide) is used as a developing agent.

Figure 7E:
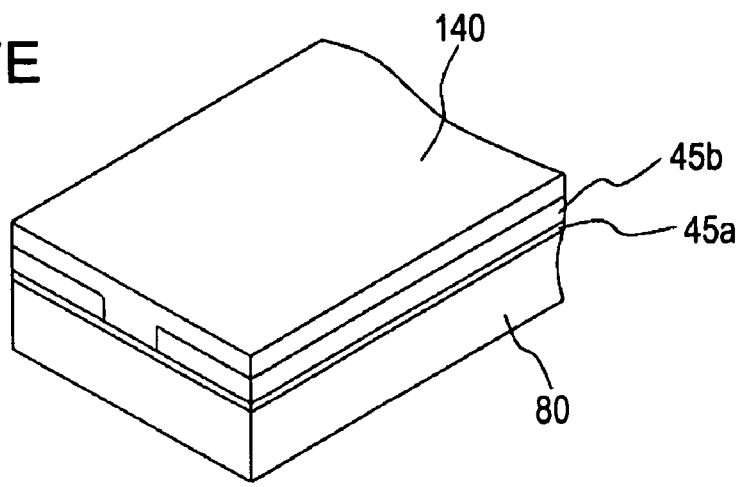

Next, as shown in FIG. 7E, a core forming film 140 having a predetermined thickness is applied onto the under clad layer 45b formed on the buffer clad layer 45a. The core forming film 140 is formed of an ultraviolet curable acrylic polymeric material that forms the waveguide core 40.

Figure 7F:
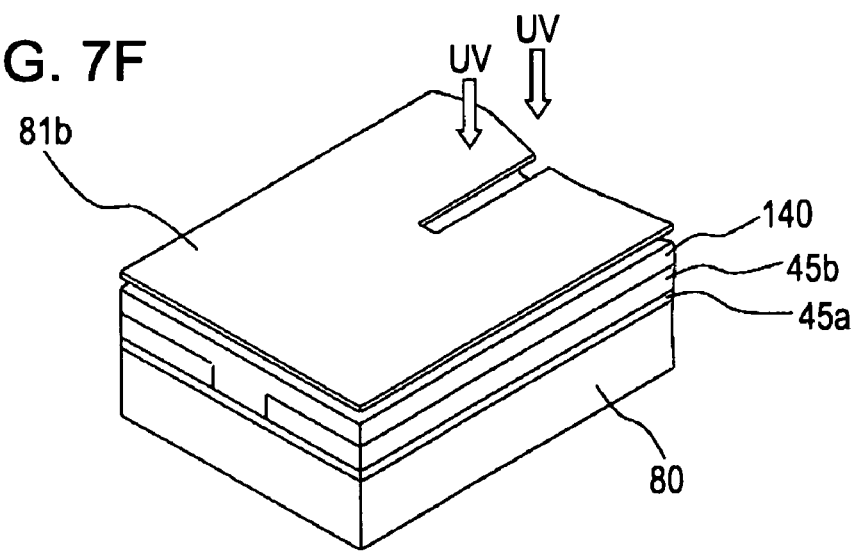
Figure 8G:
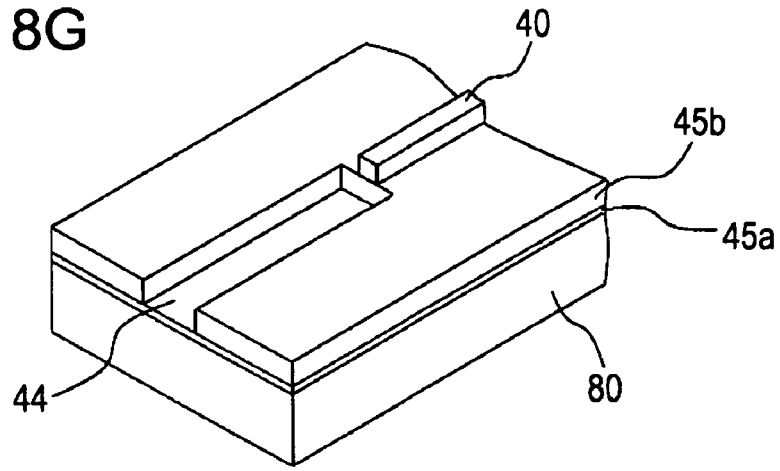
FIGS. 8G to 8I are explanatory views illustrating the production procedure for the optical waveguide.

Then, as shown in FIG. 7F, the core forming film 140 is irradiated with ultraviolet rays UV via a photomask 81b having a pattern of the waveguide core 40 shown in FIG. 2, so that a portion of the core forming film 140 that forms the waveguide core 40 is cured. As shown in FIG. 8G, a portion other than the portion corresponding to the waveguide core 40 is removed by solution development, and heat treatment is performed, so that a waveguide core 40 is formed in a predetermined pattern shown in FIG. 2.

Figure 8H:
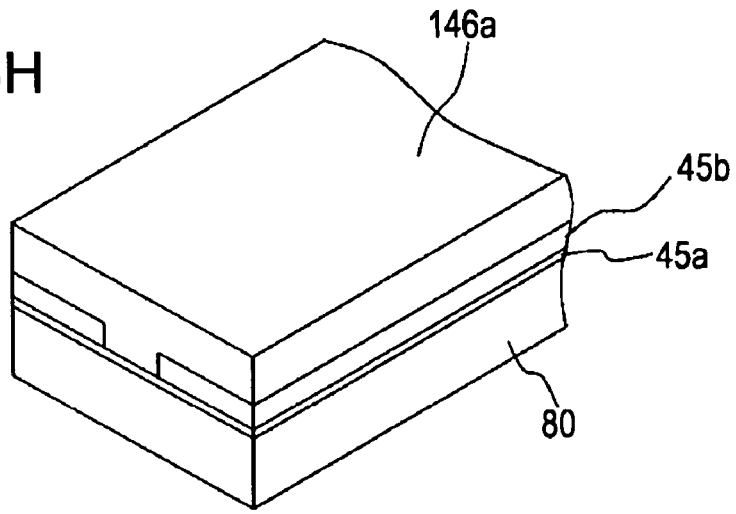

Then, as shown in FIG. 8H, an over-clad-layer forming film 146a having a predetermined thickness is applied onto the under clad layer 45b and the waveguide core 40 formed on the buffer clad layer 45a. The over-clad-layer forming film 146a is formed of the ultraviolet curable acrylic polymeric material that forms the clad 41.

Figure 8I:
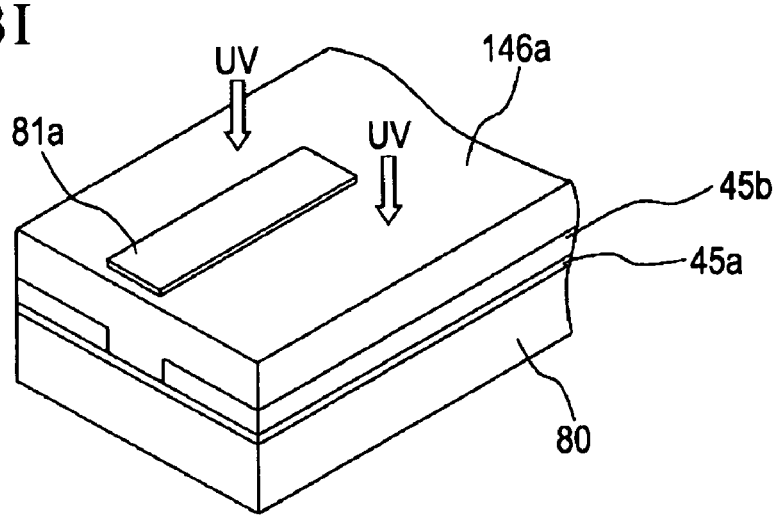
Figure 9J:
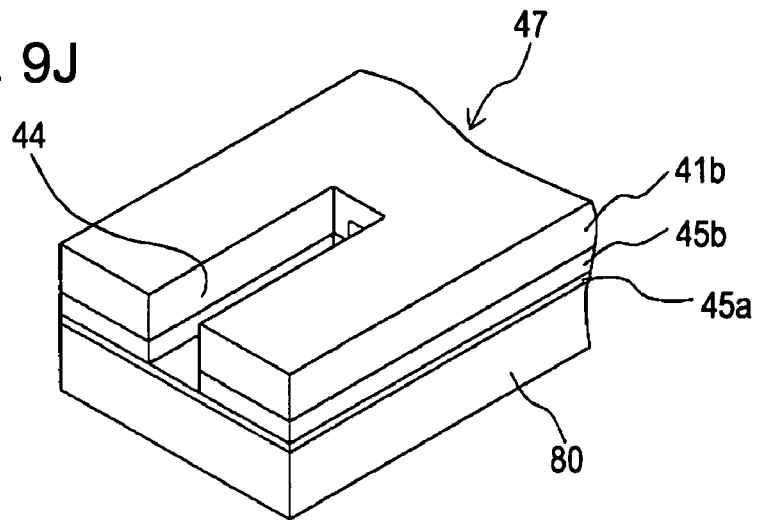
FIGS. 9J to 9L are explanatory views illustrating the production procedure for the optical waveguide.

As shown in FIG. 8I, the over-clad-layer forming film 146a is irradiated with ultraviolet rays UV via a photomask 81a having a pattern of the fiber guide groove 44, so that a portion of the over-clad-layer forming film 146a other than the portion corresponding to the fiber guide groove 44 is cured. Then, as shown in FIG. 9J, the portion of the fiber guide groove 44 is removed by solution development, and heat treatment is performed so as to form an over clad 41b.

Figure 9K:
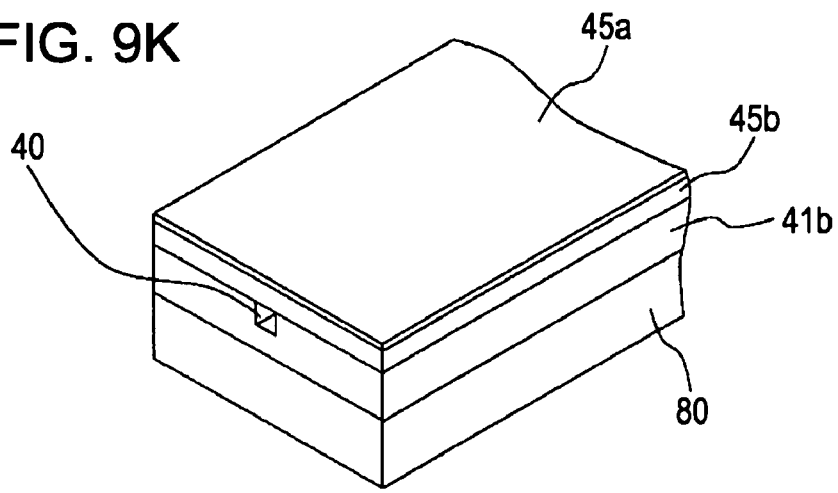
Figure 9L:
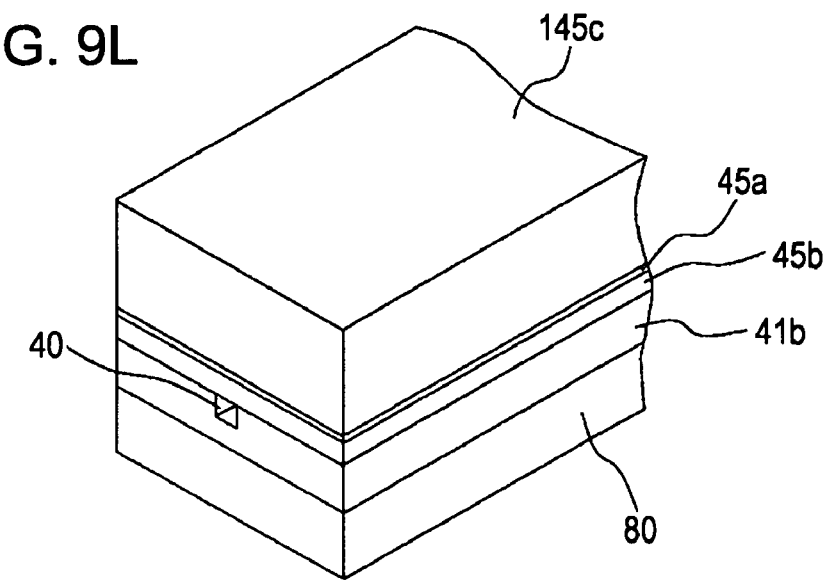

Next, a waveguide sheet 47 in which the buffer clad layer 45a, the under clad layer 45b, the waveguide core 40, and the over clad 41b are stacked and the fiber guide groove 44 is provided is separated from the wafer substrate 80, and is stuck onto the wafer substrate 80 upside down, as shown in FIG. 9K.

Then, an element-mount-layer forming film 145c having a predetermined thickness is applied on the buffer clad layer 45a serving as the uppermost layer, as shown in FIG. 9I. The element-mount-layer forming film 145c is formed of the ultraviolet curable acrylic polymeric material that forms the clad 41.

In this application step, the element-mount-layer forming film 145c is not applied in the fiber guide groove 44 because the buffer clad layer 45a is provided on the uppermost side.

Figure 10M:
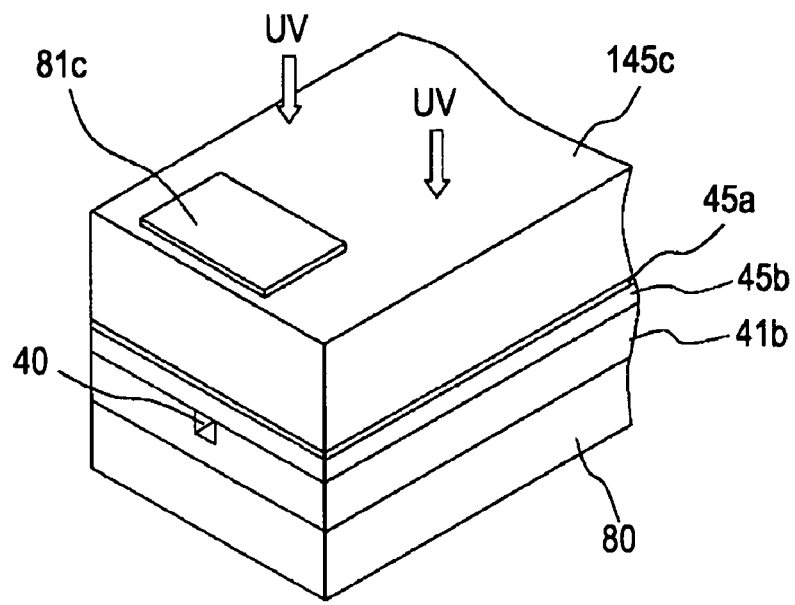
FIGS. 10M and 10N are explanatory views illustrating the production procedure for the optical waveguide.
Figure 10N:
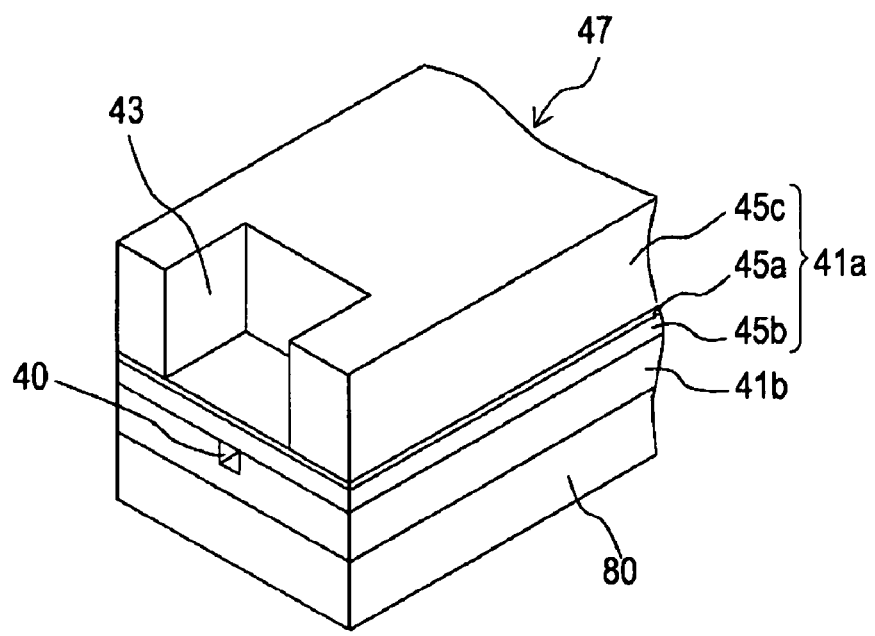

Next, as shown in FIG. 10M, the element-mount-layer forming film 145c is irradiated with ultraviolet rays UV via a photomask 81c having a pattern of an element mount opening 43 so as to cure a portion of the element-mount-layer forming film 145c other than a portions corresponding to the element mount opening 43. Then, as shown in FIG. 10N, the portion corresponding to the element mount opening 43 is removed by solution development, and heat treatment is performed so as to form an element mount layer 45c that forms the under clad 41a.

Through the above-described processes, the waveguide sheet 47 in which the waveguide core 40, the fiber guide groove 44, and the element mount opening 43 are formed in a predetermined pattern is formed on the wafer substrate 80.

In order to form the reflective surface 42 shown in FIG. 1, the waveguide sheet 47 is cut at a predetermined position with a dicing blade having an edge portion of V-shaped cross section (not shown). An end face of the waveguide sheet 47 is cut at an angle of about 45° across the waveguide core 40, thus forming a reflective surface 42.

Portions other than the reflective surface 42 are cut with a dicing blade having an edge portion of vertical cross section (not shown). Thus, the end faces of the waveguide sheet 47 are cut at an angle of about 90° at the portions other than the reflective surface 42, and the waveguide sheet 47 is thereby cut as a discrete optical waveguide 4.

Then, the waveguide sheet 47 cut as the optical waveguide 4 is separated from the wafer substrate 80. Consequently, the produced optical waveguide 4 includes the waveguide core 40 formed in a predetermined pattern, the fiber guide groove 44, the element mount opening 43, and the reflective surface 42.

Here, in order to form the fiber guide groove 44 in the upper surface of the optical waveguide 4 and form the element mount opening 43 on the lower surface of the optical waveguide 4 by a photolithographic process, the waveguide sheet 4 formed on the wafer substrate 80 is turned upside down.

In this embodiment, since film deposition is conducted on either side of the buffer clad layer 45a, stress produced in the waveguide sheet 47 by heat treatment is canceled by both surfaces of the waveguide sheet 47, and the optical waveguide 4 can be prevented from being warped.

Example of Production Procedure for Optical Module according to the Embodiment

A production procedure for the optical module 1A according to the embodiment will now be described with reference to the drawings.

The optical waveguide 4 is placed at a predetermined position on a circuit board 5 on which an optical element 2 has been mounted and electric wiring has been performed by soldering with heat, in a manner such that the under clad 41a faces down.

When the optical waveguide 4 is placed on the circuit board 5 with the under clad 41a facing down, the optical element 2 is put in a space formed below the reflective surface 42 by the element mount opening 43.

Since the optical waveguide 4 transmits light, markers (not shown) provided on an upper surface of the optical element 2 so as to indicate the reference position are checked from the side of the reflective surface 42 of the optical waveguide 4 by utilizing image recognition, and the reflective surface 42 is aligned with a light emitting section (not shown) of the optical element 2 when the optical element 2 is a light emitting element. In contrast, when the optical element 2 is a light receiving element, the reflective surface 42 is aligned with a light receiving section (not shown) of the optical element 2.

Hence, the optical waveguide 4 and the optical element 2 can be aligned by passive alignment while moving the optical waveguide 4 along the surface of the circuit board 5 without actually outputting light.

After the optical waveguide 4 is placed on the circuit board 5 on which the optical element 2 has been mounted, and is aligned with the optical element 2, an ultraviolet curable adhesive is poured between the optical waveguide 4 and the circuit board 5, and is cured by being irradiated with ultraviolet rays.

The optical waveguide 4 is thereby fixed to the circuit board 5 at a position where the waveguide cores 40 and the optical element 2 are optically coupled by the reflective surface 42.

After the optical waveguide 4 is mounted on the circuit board 5, the optical fibers 3 are inserted in the fiber guide grooves 44 of the optical waveguide 4, and the leading ends of the optical fibers 3 are brought into contact with the terminal ends of the fiber guide grooves 44. Then, the inserted optical fibers 3 are pressed by a fixing cover 6.

When the optical fibers 3 inserted in the fiber guide grooves 44 are pressed by the fixing cover 6, the center positions of the cores 30 in the optical fibers 3 are adjusted so that the optical axes of the cores 30 coincide with the optical axes of the waveguide cores 40. This allows the optical waveguide 4 and the optical fibers 3 to be connected by passive alignment with a mechanical positioning accuracy without actually outputting light.

When the ultraviolet curable adhesive 7 is poured between the optical waveguide 4 and the fixing cover 6 that presses the optical fibers 3 inserted in the fiber guide grooves 44, it is filled between the entire lower surface of the fixing cover 6 and an upper surface of the optical waveguide 4, around the optical fibers 3 inserted in the fiber guide grooves 44, and between the leading ends of the optical fibers 3 and the terminal ends of the fiber guide grooves 44 from which the end faces of the waveguide cores 40 are exposed.

The adhesive 7 between the fixing cover 6 and the optical waveguide 4 is cured by irradiation of ultraviolet rays. The optical fibers 3 are thereby fixed to the optical waveguide 4 at positions where the cores 30 are optically coupled to the waveguide cores 40 of the optical waveguide 4. The optical waveguide 4 is fixed to the circuit board 5 by being covered with the fixing cover 6.

In the above-described procedure, the optical module 1A is produced in which the optical element 2 and the optical waveguide 4 are mounted on the circuit board 5 and the optical fibers 3 are connected to the optical waveguide 4.

In an optical module using an optical waveguide having a reflective surface as an optical-path changing function at an end thereof, in order to mount an optical element on the lower side of the optical waveguide, optical waveguides are stuck one by one on a silicon platform on which optical elements are mounted, and the silicon platform is then mounted on a circuit board. Moreover, recesses in which the optical elements are mounted are formed in the silicon platform.

For this reason, much labor is taken to produce the optical modules of the related art, and the optical modules are not suitable for mass production. Moreover, the material cost for forming the silicon platform is high, and cost reduction of the optical modules is difficult.

In addition, since the optical element and the circuit board are electrically connected after the platform on which the optical element and the optical waveguide have been mounted is mounted on the circuit board, heat is applied to the optical waveguide.

In contrast, in the optical module 1A of the embodiment, in order to mount the optical element 2 on the lower side of the optical waveguide 4 having the reflective surface 42, the element mount opening 43 is formed in the under clad 41a. Therefore, the optical element 2 can be mounted below the reflective surface 42 without providing a silicon platform on the lower side of the optical waveguide 4 so as to adjust the height.

This can omit the step of sticking optical waveguides to the silicon platform for height adjustment, and the step of forming the silicon platform. In addition, since the height adjustment function can be switched from the silicon platform to the material of the optical waveguide, in this embodiment, to the material that forms the clad 41, the material cost can be reduced.

Further, since the optical waveguide 4 is mounted on the circuit board 5 on which the optical element 2 has been mounted and has been subjected to electric wiring by soldering with heat, it is prevented from being heated.

Modification of Optical Module of the Embodiment

While the optical element and the optical fibers are connected by using the optical waveguide in the above-described optical module, the present invention is also applicable to a structure in which a reflective surface is provided at each end of the optical waveguide in the extending direction of the waveguide cores and optical elements are connected by the optical waveguide.

It should be understood by those skilled in the art that various modifications, combinations, sub-combinations and alterations may occur depending on design requirements and other factors insofar as they are within the scope of the appended claims or the equivalents thereof.

What is claimed is:

1. An optical module comprising:
an optical waveguide including a waveguide core through which light propagates, and a clad configured to trap the light in the waveguide core; and
a circuit board on which a surface-type optical element is mounted,
wherein the optical waveguide further includes:
a reflective surface from which an end face of the waveguide core is exposed, the reflective surface being provided on an inclined face at one end face of the optical waveguide in an extending direction of the waveguide core;
an opposing pair of waveguide support portions integrally formed with the clad and disposed apart from one another, each one of the pair of waveguide support portions having an inner waveguide support wall such that the inner waveguide support walls face each other; and
an element mount opening formed into the clad such as to be opposite from the reflective surface, the element mount opening having a size such as to contain the optical element,
wherein the optical waveguide is mounted on the circuit board while the optical element is contained in the element mount opening and is aligned with the reflective surface of the optical waveguide and
wherein the element mount opening is defined by the inner waveguide support walls of the opposing pair of waveguide support portions, a light incident/exit surface of the clad spanning the inner waveguide support walls through which light perpendicularly enters thereinto or perpendicularly propagates therefrom and a rear surface of the clad spanning the inner waveguide support walls and extending perpendicularly from the light incident/exit surface.

2. The optical module according to claim 1, wherein a waveguide support portion configured to support the optical waveguide on the circuit board is formed by a portion of the clad facing the reflective surface, the portion being provided at a position where the waveguide core is not provided.

3. The optical module according to claim 1, wherein the optical waveguide further includes a fiber guide groove provided at the other end face of the optical waveguide in the extending direction of the waveguide core, the fiber guide groove being opened in a shape such that an optical fiber is inserted therein, and configured to align and couple the inserted optical fiber to the waveguide core.

4. The optical module according to claim 3, wherein the optical waveguide is formed of a polymeric material, and the element mount opening and the fiber guide groove are formed by a photolithographic process.

5. An optical waveguide comprising:
a waveguide core through which light propagates;
a clad configured to trap the light in the waveguide core;
a reflective surface from which an end face of the waveguide core is exposed, the reflective surface being provided on an inclined face at one end face of the optical waveguide in an extending direction of the waveguide core;
an opposing pair of waveguide support portions integrally formed with the clad and disposed apart from one another, each one of the pair of waveguide support portions having an inner waveguide support wall such that the inner waveguide support walls face each other; and
an element mount opening formed into the clad such as to be opposite from the reflective surface, the element mount opening having a size such as to contain an optical element that is to be optically coupled to the waveguide core via the reflective surface,
wherein the element mount opening is defined by the inner waveguide support walls of the opposing pair of waveguide support portions, a light incident/exit surface of the clad spanning the inner waveguide support walls through which light perpendicularly enters thereinto or perpendicularly propagates therefrom and a rear surface of the clad spanning the inner waveguide support walls and extending perpendicularly from the light incident/exit surface.

6. The optical waveguide according to claim 5, wherein a waveguide support portion is formed by a portion of the clad facing the reflective surface, the waveguide support portion being provided at a position where the waveguide core is not provided.

7. The optical waveguide according to claim 5, further comprising:
a fiber guide groove provided at the other end face of the optical waveguide in the extending direction of the waveguide core, the fiber guide groove being opened in a shape such that an optical fiber is inserted therein, and configured to align and couple the inserted optical fiber to the waveguide core.

8. The optical waveguide according to claim 7, wherein the optical waveguide is formed of a polymeric material, and the element mount opening and the fiber guide groove are formed by a photolithographic process.

* * * * *